US012746746B2

(12) United States Patent
Teraji

(10) Patent No.: US 12,746,746 B2
(45) Date of Patent: Sep. 29, 2026

(54) ELECTRONIC APPARATUS

(71) Applicant: CANON KABUSHIKI KAISHA, Tokyo (JP)

(72) Inventor: Tomoya Teraji, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 18/539,513

(22) Filed: Dec. 14, 2023

(65) Prior Publication Data

US 2024/0198661 A1 Jun. 20, 2024

(30) Foreign Application Priority Data

Dec. 19, 2022 (JP) ................................. 2022-202148

(51) Int. Cl.
*B41J 2/045* (2006.01)
*H05K 5/02* (2006.01)

(52) U.S. Cl.
CPC ......... *B41J 2/04548* (2013.01); *B41J 2/0458* (2013.01); *H05K 5/0247* (2013.01)

(58) Field of Classification Search
CPC .... B41J 2/04548; B41J 2/0458; B41J 15/048; B41J 2/04501; B41J 29/393; B41J 29/38; B41J 29/387; H05K 5/0247; G06F 1/266
See application file for complete search history.

(56) References Cited

U.S. PATENT DOCUMENTS

| | | | | |
|---|---|---|---|---|
| 10,037,256 B2 * | 7/2018 | Choi | ...................... | G09G 3/006 |
| 2019/0199391 A1 * | 6/2019 | Mori | ...................... | G01S 7/028 |

FOREIGN PATENT DOCUMENTS

| | | |
|---|---|---|
| JP | H06-11921 A | 1/1994 |

* cited by examiner

*Primary Examiner* — Kristal Feggins
(74) *Attorney, Agent, or Firm* — Venable LLP

(57) ABSTRACT

An electronic apparatus provided with an external unit being attachable to and detachable from a main body unit, includes: a main body connector attached to the main body unit and including an input contact of a driving circuit to drive a driving device for the external unit, and an output contact from a first power source; and a loop-back unit including a path to connect the output contact and the input contact to the external unit, in which the main body connector includes a ground contact between the output contact and the input contact.

12 Claims, 23 Drawing Sheets

ELECTRONIC APPARATUS

BACKGROUND OF THE INVENTION

Field of the Invention

The present disclosure relates to an electronic apparatus which can stop an operation properly in a case where a detachable external unit is detached.

Description of the Related Art

Products that mount high voltage devices are required to meet specifications concerning protection against a high voltage as international standards depending on categories that the products belong to. Information processing apparatuses are required to comply with IEC60950-1 and IEC62368-1 while domestic electronic apparatuses are required to meet IEC60335-1 as international standards. In order to comply with the international standards, a structure to avoid a malfunction needs to be provided at a location accessible to a user in consideration of safety.

FIG. 1 shows an image forming apparatus that mounts a high voltage generator of the related art. The image forming apparatus includes a fixing unit 103 that is attachable to and detachable from an apparatus main body 101 through connectors 102 and 104, and supplies a high voltage from a high voltage generator 100 to the fixing unit 103. A power source to be supplied to the high voltage generator 100 is supplied from a direct-current power source 105 provided to the apparatus main body 101 through the connectors 102 and 104. The connector 104 has a terminal structure of a loop-back 107. According to this configuration, the loop-back 107 is released in a case where the fixing unit 103 is detached from the apparatus main body 101, and the supply of the power source to the high voltage generator 100 is stopped (see Japanese Patent Laid-Open No. H06-011921).

However, according to the configuration of the related art, in a case where the connector 102 of the apparatus main body 101 is a connector in the form of a male terminal, a user may unintentionally short-circuit the male terminal of the connector 102 on a receiving side of the loop-back 107 with a metal and the like. In this instance, a high voltage is outputted from the high voltage generator 100 due to the same action as that of the loop-back of the connector 104. Hence, the high voltage is also generated at the male terminal of the connector 102 which corresponds to the output from the high voltage generator 100, and the user may touch the terminal or the image forming apparatus may cause a malfunction.

SUMMARY OF THE INVENTION

An aspect of the embodiment according to the present disclosure is an electronic apparatus provided with an external unit being attachable to and detachable from a main body unit, including: a main body connector attached to the main body unit and including an input contact of a driving circuit to drive a driving device for the external unit, and an output contact from a first power source; and a loop-back unit including a path to connect the output contact and the input contact to the external unit, in which the main body connector includes a ground contact between the output contact and the input contact.

Further features of the present invention will become apparent from the following description of exemplary embodiments with reference to the attached drawings.

DESCRIPTION OF THE EMBODIMENTS

Embodiments of the present disclosure will be described below in detail with reference to the drawings.

First Embodiment

Figure 1:
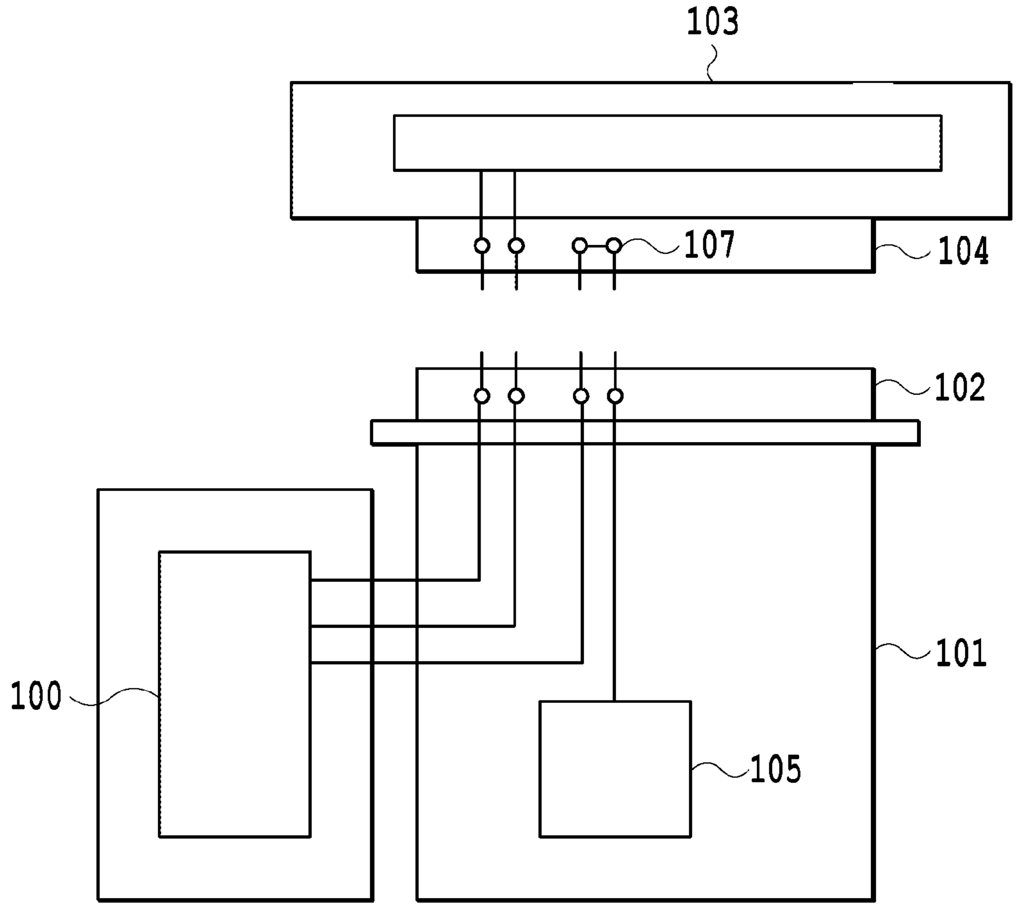
FIG. 1 is a configuration diagram showing an image forming apparatus that mounts a high voltage generator of the related art.
Figure 2:
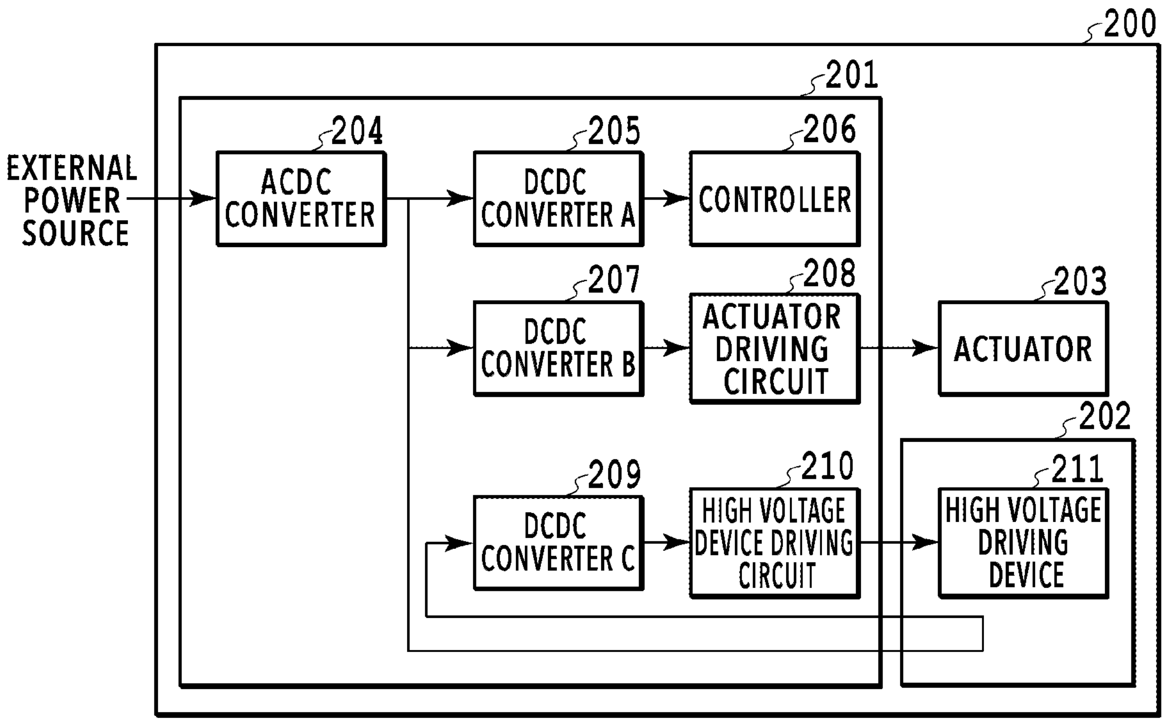
FIG. 2 is a block diagram, showing a configuration of an electronic apparatus according to a first embodiment.

FIG. 2 shows a configuration of an electronic apparatus according to a first embodiment. An electronic apparatus 200 is formed from a main body unit 201, an external unit 202, and an actuator 203. The external unit 202 is attachable and detachable, and is attached and detached by a user or a service staff who conducts maintenance of the electronic apparatus for the purpose of replacement of the external unit 202 and maintenance work. An ACDC converter 204 in the main body unit 201 is connected to an external power source and supplies a power source into the electronic device. An output terminal of the ACDC converter 204 is connected to DCDC converters. A controller 206 that controls the entire electronic apparatus 200 is connected to a DCDC converter A 205. An actuator driving circuit 208 is connected to a DCDC converter B 207. The actuator driving circuit 208 drives the actuator 203 installed in the electronic apparatus 200.

A DCDC converter C 209 outputs a high voltage. According to IEC60950-1 and IEC60335-1, the high voltage is defined as a direct-current voltage equal to or above 60 V or an alternating-current voltage having a peak value equal to or above 42.4 V. Although the present disclosure will describe an example of an electronic apparatus that supplies a high voltage from a high voltage generator, the present invention is applicable not only to the voltage value equal to or above 42.4 V but also to any voltage value. The DCDC converter C 209 is connected to the ACDC converter 204, which serves as the power source, as with other DCDC converters but is different therefrom in that the DCDC converter C 209 is connected to the ACDC converter 204 through the external unit 202. An output terminal of the DCDC converter C 209 is connected to a high voltage device driving circuit 210. The high voltage device driving circuit 210 drives a high voltage driving device 211 mounted on the external unit 202 by using the high voltage outputted from the DCDC converter C 209.

Figure 3:
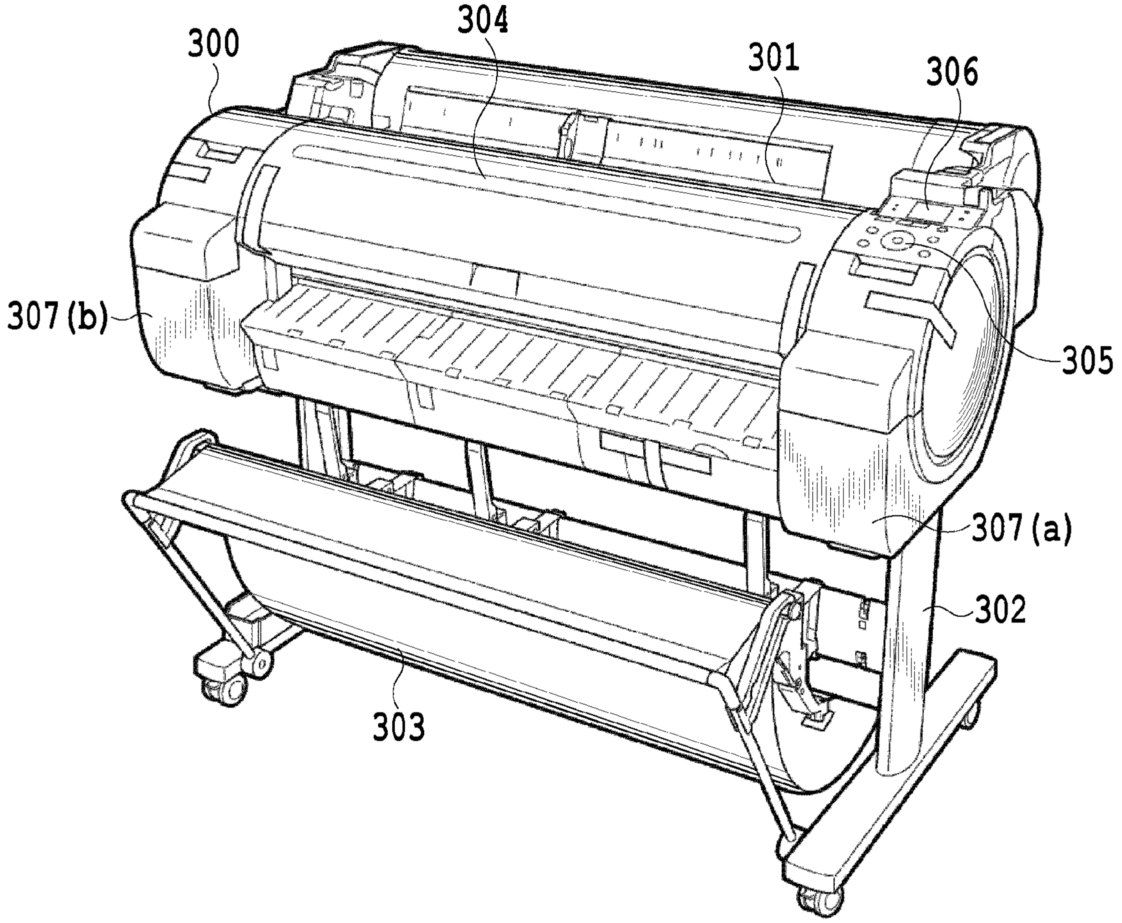
FIG. 3 is an external perspective view of a printing apparatus shown as an example of the electronic apparatus.

FIG. 3 shows external appearance of a printing apparatus using a print medium as an example of the electronic apparatus. An insertion slot 301 is provided to an upper back face of a printing apparatus 300, so that print media such as print paper can be manually supplied or rolled paper can be supplied. The printing apparatus 300 is supported by a printer stand 302 formed from two leg portions. The printing apparatus 300 includes a discharge tray 303 which loads the discharged print media and the like, and an upper cover 304 through which the inside can be seen and which is openable and closable. An operating panel unit 305 and a screen panel unit 306 that provides a user with information are disposed on a right side of an apparatus main body of the printing apparatus 300. Meanwhile, ink supply units and ink tanks 307 are installed on two sides of the apparatus main body.

Figure 4:
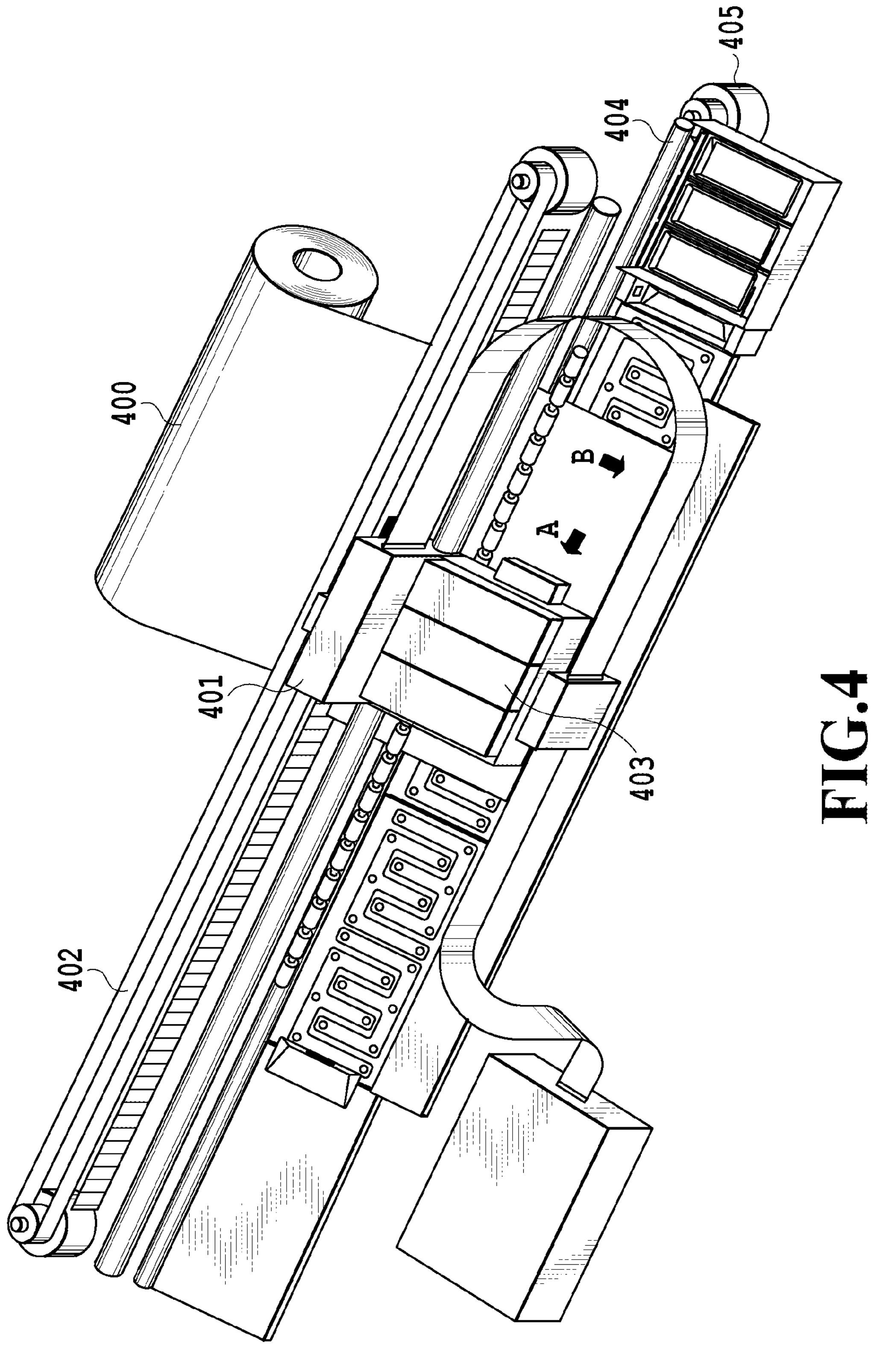
FIG. 4 is a diagram showing a configuration inside a main body of the printing apparatus.

FIG. 4 shows a configuration inside the main body of the printing apparatus. FIG. 4 shows a state of detaching the upper cover 304 of the printing apparatus shown in FIG. 3. The printing apparatus includes a transport roller 404 for transporting a print medium 400 in a direction of an arrow B (a sub scanning direction), and a transport motor 405 for moving the transport roller 404. The printing apparatus further includes a carriage unit 401 which is reciprocally guided in a width direction (a direction of an arrow A, a main scanning direction) of the print medium. The printing apparatus includes a carriage motor (not shown) for reciprocating the carriage unit 401 in the direction of the arrow A, a carriage belt 402, and a print head 403 attached to the carriage unit 401. Here, the print head 403 is attachable to and detachable from the carriage unit 401. In a case of an attachment failure to the carriage unit 401, it is possible to attach the print head 403 once again or to replace the print head 403 with a new print head.

Figure 5:
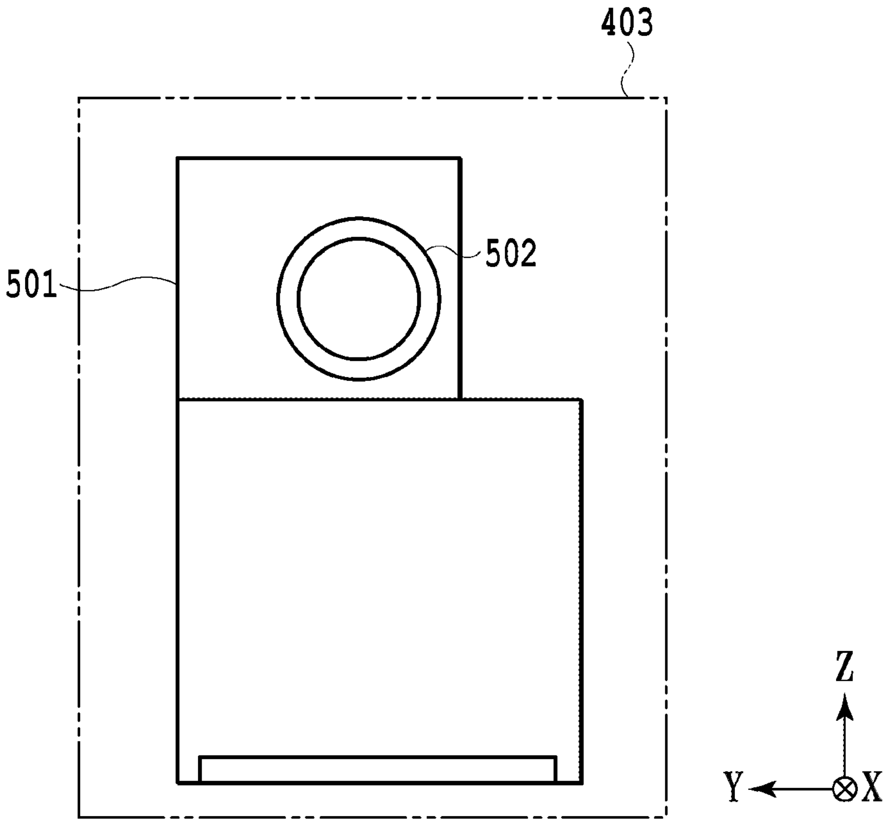
FIG. 5 is a diagram showing a configuration of a print head of the printing apparatus.

FIG. 5 shows a configuration of the print head of the printing apparatus. A circulating pump 501 for circulating an ink inside the print head 403 and a heater (not shown) for converting electric energy into thermal energy in order to eject the ink are mounted on the print head 403. The circulating pump 501 is provided with a piezoelectric element 502 for converting the electric energy into mechanical energy. In a case where a voltage is applied between terminals of the piezoelectric element 502, a distortion proportional to the applied voltage is generated by an electrostrictive effect. The ink inside the print head 403 is circulated by causing a not-illustrated diaphragm provided to the circulating pump 501 to vibrate by use of this distortion. A 50 V rectangular or sinusoidal wave drive voltage is applied to the piezoelectric element 502.

The printing apparatus 300 described with reference to FIGS. 3 to 5 represents an example of the electronic apparatus 200 shown in FIG. 2. The actuator 203 in FIG. 2 corresponds to the transport motor 405 and the carriage motor in the printing apparatus 300, the high-voltage driving device 211 corresponds to the piezoelectric element 502 and the heater therein, and the external unit 202 corresponds to the print head 403 of the printing apparatus 300. The present disclosure is widely adapted to electronic apparatuses in general. Although the printing apparatus has been described as an example, the present embodiment is not limited to the printing apparatus. The following description will explain embodiments as the electronic apparatus.

Figure 6:
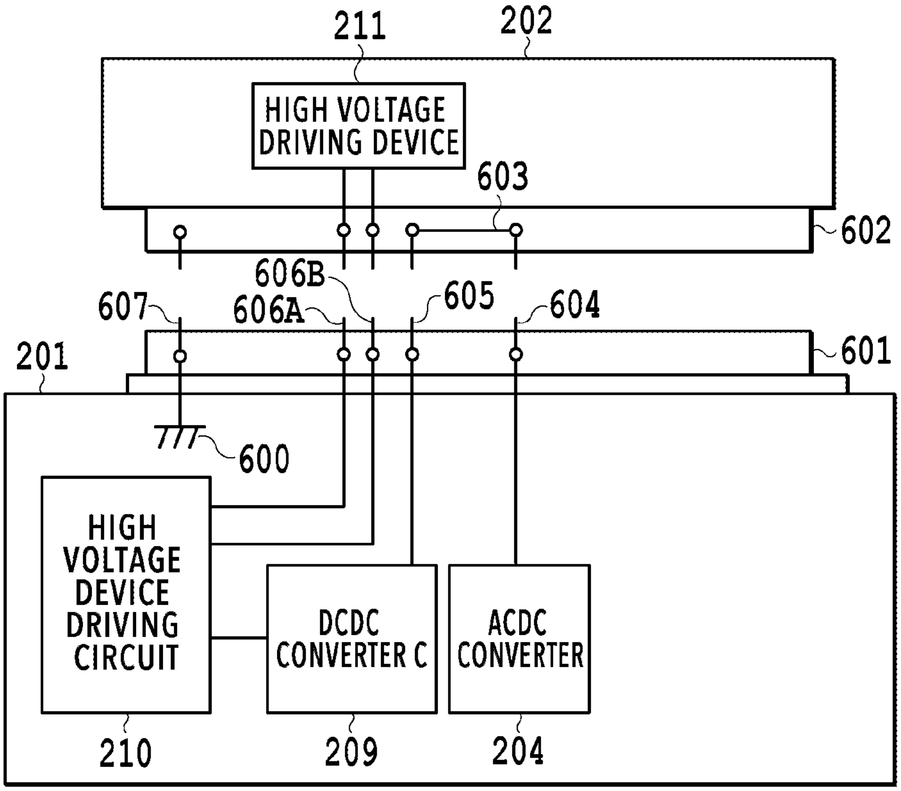
FIG. 6 is a diagram showing connection among units in the electronic apparatus of the first embodiment.

FIG. 6 shows connection among units in the electronic apparatus of the first embodiment. FIG. 6 shows connection between the main body unit 201 and the external unit 202 of the electronic apparatus 200. The main body unit 201 is connected to the external unit 202 by fitting a main body connector 601 that is attached to the main body unit 201 to an external connector 602 that is attached to the external unit 202. The external connector 602 is connected to the main body connector 601 by the attachment of the external unit 202 (the print head 403) and the carriage unit 401. After the main body connector 601 is connected to the external connector 602, the output of the ACDC converter 204 is outputted from an output contact 604 of the main body connector 601, passed through the external unit 202, and inputted to an input contact 605 of the main body connector 601. Then, the input contact 605 is connected to the DCDC converter C 209 of the main body unit 201. A path for returning the output from the ACDC converter 204 to the main body unit 201 through the external unit 202 is referred to as a loop-back 603.

In the case where the main body connector 601 is detached from the external connector 602, the ACDC converter 204 can no longer be connected physically to the DCDC converter C 209 through the loop-back 603. In this instance, the high voltage is not outputted from the DCDC converter C 209. Accordingly, the high voltage is not outputted from the high voltage device driving circuit 210, either. Hence, the high voltage is not outputted to contacts 606A and 606B for the high voltage driving device 211 provided to the main body connector 601. A contact (hereinafter referred to as a ground contact 607) of a ground 600 of the main body unit 201 is also allocated to the main body connector 601. This ground contact 607 may be a contact for connecting a chassis of the external unit 202 to the ground 600. Alternatively, a substrate having a different ground may be provided to the external unit 202, and the ground contact 607 may be a contact for connecting the ground of this substrate to the ground 600 of the main body unit 201.

Figure 7:
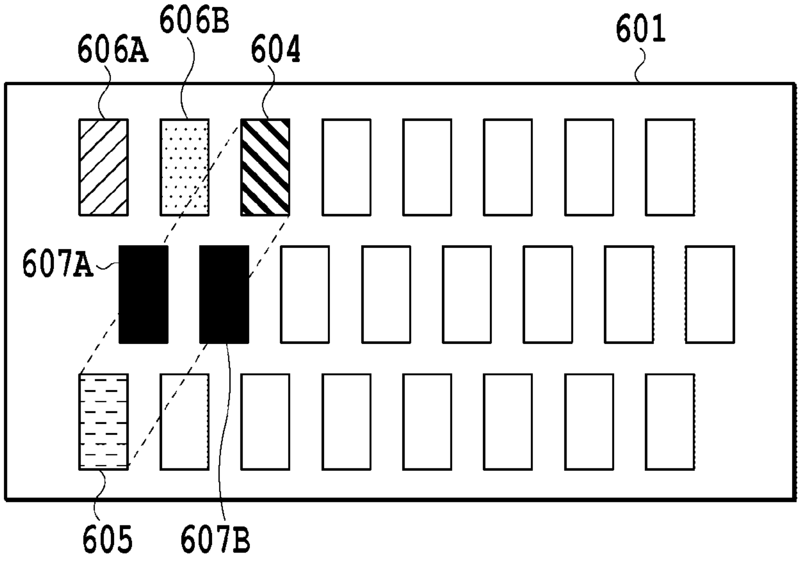
FIG. 7 is a diagram showing a layout of contacts of a main body connector.

FIG. 7 shows a layout of the contacts of the main body connector. The main body connector 601 includes the contacts 606A and 606B for the high voltage driving device 211, the ground contact 607, and the output contact 604 and the input contact 605 to be connected to the loop-back, which are shown in FIG. 6. The main body connector 601 includes other contacts for supplying signals and a power source necessary for other devices mounted on the external unit 202. These other contacts are fitted and connected to the external connector 602, thus enabling functional connection between the main body unit 201 and the external unit 202. These other contacts (the white contacts shown in FIG. 7. hereinafter referred to as general-purpose contacts) are signals or a power source which do not have a power supply capability sufficient for driving the high voltage driving device 211. In the meantime, even in a case where the main body connector 601 is detached from the external connector 602 and these other general-purpose contacts are short-circuited with the input contact 605, electric power necessary for the high voltage device driving circuit 210 is not supplied through the DCDC converter C 209. In other words, the high voltage device driving circuit 210 cannot drive the high voltage driving device 211.

Meanwhile, in a case where the main body connector 601 is detached from the external connector 602 and a short circuit is caused by erroneous contact of a conductive material between the output contact 604 and the input contact 605, the conductive material acts like the loop-back 603. As a consequence, a high voltage is outputted from the DCDC converter C 209 of the main body unit 201. Accordingly, ground contacts 607A and 607B are disposed as contacts located between the output contact 604 and the input contact 605. The ground contacts 607A and 607B are preferably disposed in such a way as to overlap a region (hereinafter referred to as a short-circuit region) surrounded by two straight lines each connecting between an outer edge of the output contact 604 and an outer edge of the input contact 605. In the case where the ground contacts 607A and 607B are disposed as described above, the conductive material that comes into contact erroneously between the output contact 604 and the input contact 605 is highly likely to come into contact with any of the ground contacts 607 as well. In this instance, an electric current flows from the output contact 604 to the ground contact 607, and the power source is not supplied to the input contact 605. For this reason, the high voltage is not outputted from the DCDC converter C 209 of the main body unit 201. Accordingly, the high voltage is not outputted from the contacts 606A and 606B of the main body connector 601 for the high voltage driving device 211, either.

As a consequence, in the case where the conductive material erroneously comes into contact between the output contact 604 and the input contact 605, the high voltage is not outputted even if the user touches a terminal of the main body connector 601. Thus, it is possible to secure user safety.

Shapes of contact terminals of the main body connector 601 and the external connector 602 are not limited to rectangular shapes as shown in FIG. 7. In each of the connectors, the shape of a terminal on a contact surface where the contact is exposed may take on any shape such as a round shape as long as both of the connecters can be fitted to each other so as to establish electrical connection. The above-mentioned short-circuit region is defined as described below irrespective of the shapes of the terminals. Specifically, the short-circuit region is defined as a region surrounded by a straight line that is in contact with one side of the outer edge of one terminal (the output contact 604) and is in contact with the same side of the outer edge of another terminal (the input contact 605), and by a straight line that is in contact with another side of the outer edge of the one terminal and is in contact with the same side of the outer edge of the other terminal.

The connectors of the first embodiment include the contacts that are arranged on three rows. Instead, the contacts may be arranged on one or two rows or on four or more rows. In the case of the connector in which the contacts are arranged on just one row, at least one ground contact may be disposed between the output contact 604 and the input contact 605. The same applies to a case of the connector in which the contacts are arranged on two or more rows and the output contact 604 and the input contact 605 are arranged on the same row.

Although the two ground contacts 607 are provided in the first embodiment, the number of the ground contacts 607 is not limited. A single ground contact 607 or multiple ground contacts 607 may be provided as long as such a ground contact 607 can be disposed between the output contact 604 and the input contact 605. Although the description has been given of the case of newly proving the ground contacts 607 between the output contact 604 and the input contact 605, the layout of the contacts may be determined by use of other ground contacts that are disposed in advance for a difference purpose.

The ground contacts 607 are preferably disposed in the vicinity of two contacts in an attempt of avoiding a malfunction due to the erroneous connection between these two contacts. It is more preferable to dispose the ground contacts 607 at contacts that are adjacent to these two contacts. Most of the contacts disposed in the vicinity of these two contacts overlap the aforementioned short-circuit region. Accordingly, it is possible to reduce the number of the ground contacts 607 to be disposed in the short-circuit region by defining only the contacts disposed in the vicinity of the two contacts as the ground contacts 607.

Note that the same operation and effects can be obtained by disposing the aforementioned general-purpose contacts instead of the ground contacts 607 to be disposed in the short-circuit region.

Second Embodiment

An electronic apparatus according to a second embodiment will be described by focusing only on different features from those of the electronic apparatus of the first embodiment.

Figure 8:
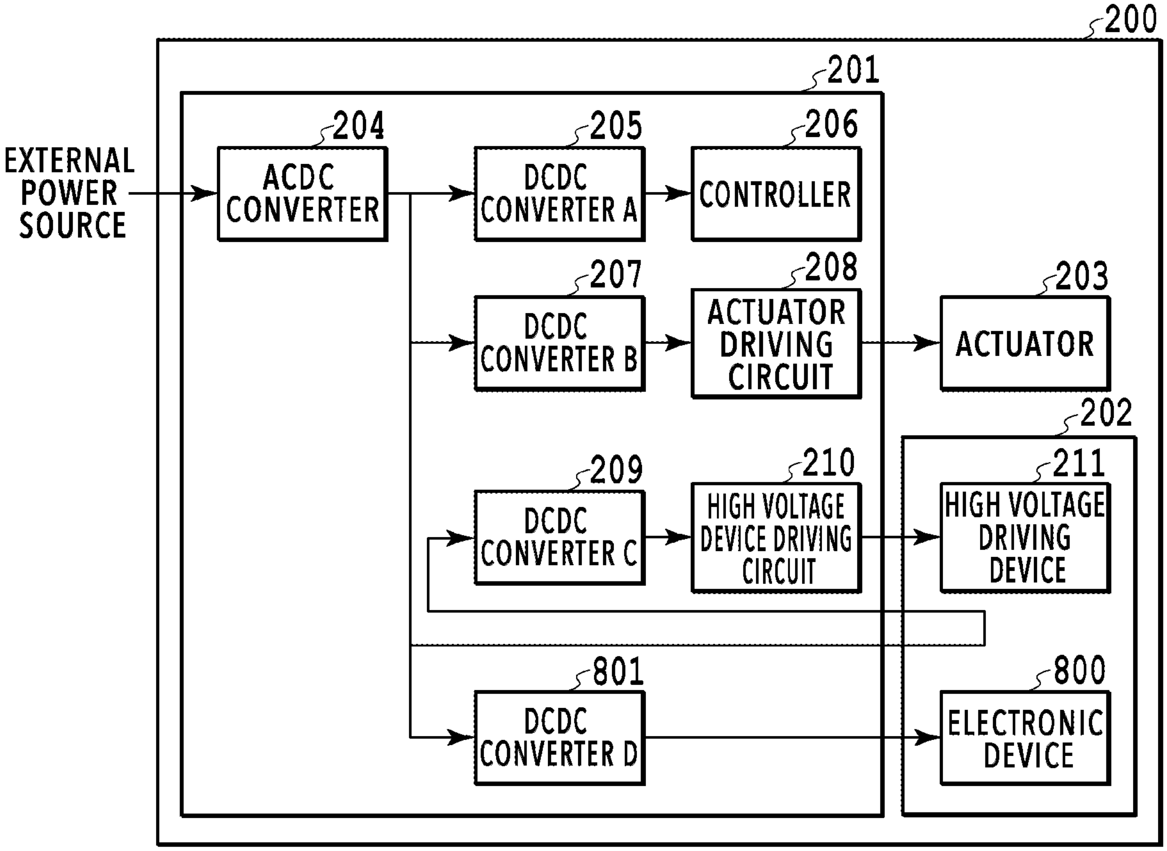
FIG. 8 is a block diagram showing a configuration of an electronic apparatus according to a second embodiment.

FIG. 8 shows a configuration of the electronic apparatus according to the second embodiment. In the second embodiment, an electronic device 800 is mounted on the external unit 202 in addition to the high voltage driving device 211. The electronic device 800 may be a component of a control unit such as memory and a microcomputer, or may be an actuator. The electronic device 800 receives power supply from a DCDC converter D 801. The DCDC converter D 801 receives power supply from the ACDC converter 204, transforms the power into a predetermined voltage, and supplies the transformed voltage to the electronic device 800.

Figure 9:
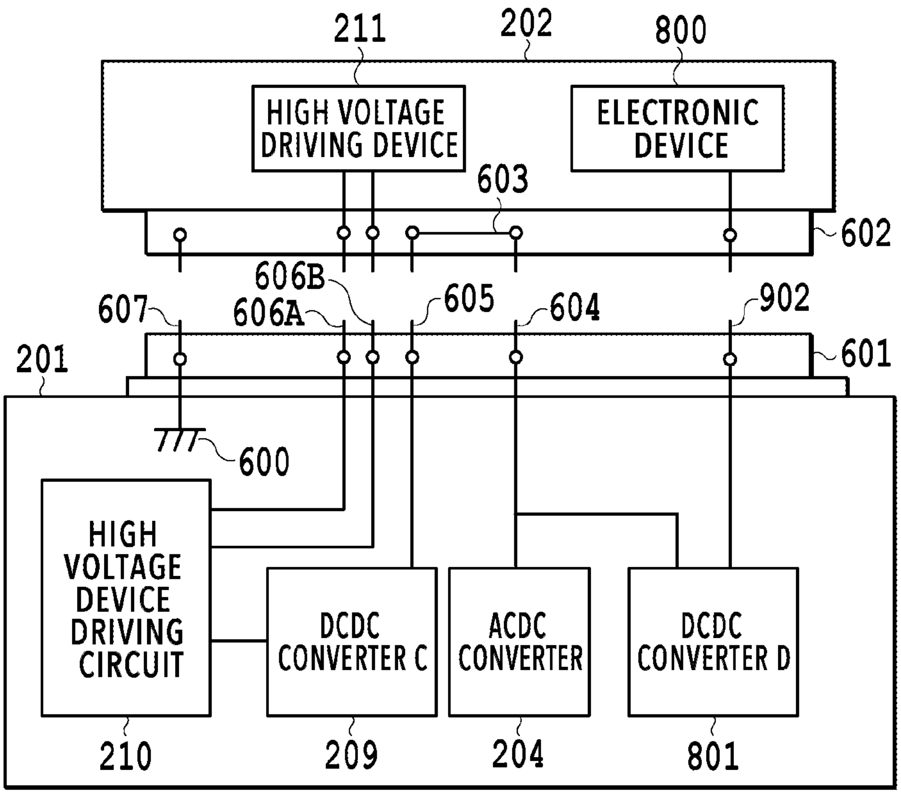
FIG. 9 is a diagram showing connection among units in the electronic apparatus of the second embodiment.

FIG. 9 shows connection among units in the electronic apparatus of the second embodiment. The main body unit 201 is connected to the external unit 202 by fitting the main body connector 601 to the external connector 602. An output terminal of the DCDC converter D 801 is connected to the electronic device 800 of the external unit 202 through a contact 902 for the electronic device 800 provided to the main body connector 601. The electronic device 800 is operated by receiving power supply from the DCDC converter D 801.

Figure 10:
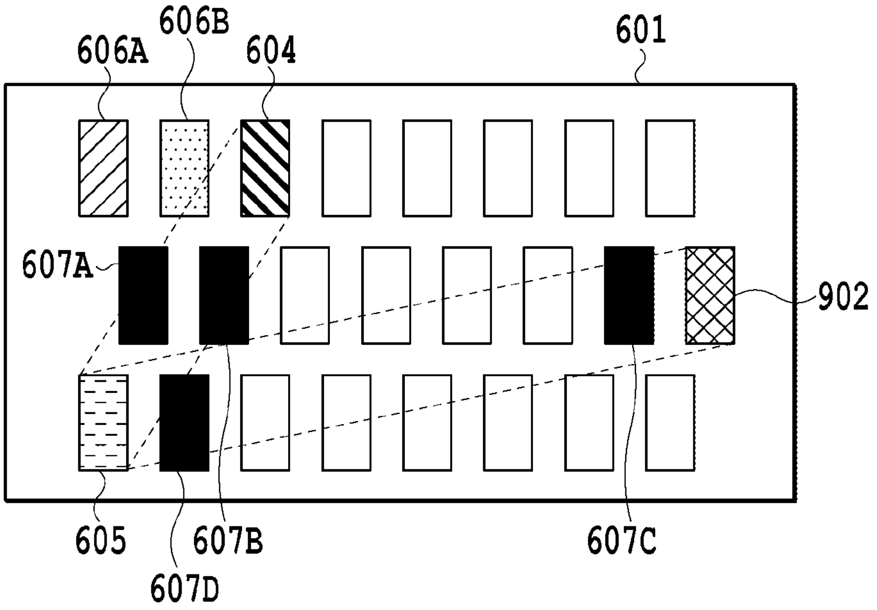
FIG. 10 is a diagram showing a first example of a layout of contacts of a main body connector.

FIG. 10 shows a first example of a layout of the contacts of the main body connector. The main body connector 601 includes the contacts 606A and 606B for the high voltage driving device 211, the ground contact 607, and the output contact 604 and the input contact 605 connected to the loop-back, which have been explained with reference to FIG. 6. The main body connector 601 includes other contacts for supplying signals and a power source necessary for other devices mounted on the external unit 202. The contact 902 for the electronic device 800 connected to an output terminal of the DCDC converter D 801 is also arranged as one of contacts of the main body connector 601.

The layout of the ground contacts 607A and 607B disposed between the output contact 604 and the input contact 605 is the same as the first embodiment.

Meanwhile, in the case where the main body connector 601 is detached from the external connector 602 and a short circuit is caused by erroneous contact of a conductive material between the contact 902 for the electronic device 800 and the input contact 605, the conductive material acts like the loop-back. In other words, the output terminal of the DCDC converter D 801 is connected to an input terminal of the DCDC converter C 209. In the case where the output from the DCDC converter D 801 has a sufficient supply capacity for allowing the DCDC converter C 209 to output a high voltage, the high voltage is outputted from the DCDC converter C 209. In the case where the high voltage device driving circuit 210 is operated even though the main body unit 201 does not control the external unit 202, there is a possibility of causing an unexpected malfunction.

Given the circumstances, ground contacts 607C and 607D are disposed in such a way as to overlap a short-circuit region surrounded by two straight lines each connecting between an outer edge of the contact 902 for the electronic device 800 and the outer edge of the input contact 605. In the case where the ground contacts 607C and 607D are disposed as described above, the conductive material that comes into contact erroneously between the output contact 902 and the input contact 605 is highly likely to come into contact with the ground contacts 607C and 607D as well. In this instance, an electric current flows from the contact 902 for the electronic device 800 to the ground contact 607, and the power source is not supplied to the input contact 605. Meanwhile, since the high voltage is not outputted from the DCDC converter C 209 of the main body unit 201, the high voltage is not outputted to the contacts 606A and 606B for the high voltage driving device 211 provided to the main body connector 601, either.

As a consequence, the high voltage is not outputted even if the user touches a terminal of the main body connector 601. Thus, it is possible to secure user safety and to prevent a malfunction of the electronic apparatus.

Figure 11:
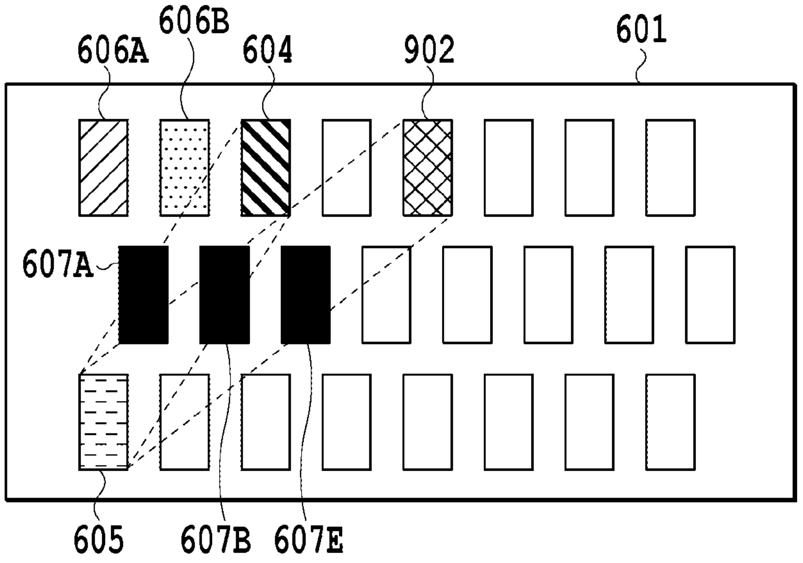
FIG. 11 is a diagram showing a second example of the layout of contacts of the main body connector.

FIG. 11 shows a second example of the layout of contacts of the main body connector. In the main body connector 601, the location of the contact 902 for the electronic device 800 is different from that of the above-described first example. A ground contact 607E is provided as a contact disposed between the contact 902 for the electronic device 800 and the input contact 605. The ground contact is preferably disposed in such a way as to overlap a short-circuit region surrounded by two straight lines each connecting between the outer edge of the contact 902 for the electronic device 800 and the outer edge of the input contact 605. However, this region cannot be sufficiently covered only with the newly disposed ground contact 607E. In the meantime, the ground contact 607B provided between the output contact 604 and the input contact 605 also overlaps this short-circuit region. Accordingly, the ground contact 607B can also be used as the ground contact disposed between the contact 902 and the input contact 605.

Although one or two ground contacts 607 are provided in the second embodiment, the number of the ground contacts 607 is not limited. A single ground contact 607 or multiple ground contacts 607 may be provided as long as such a ground contact 607 can be disposed between the contact 902 for the electronic device 800 and the input contact 605. The description has been given of the case of newly proving the ground contacts 607 between the contact 902 for the electronic device 800 and the input contact 605. On the other hand, the layout of the contacts may be determined by use of other ground contacts disposed in advance for a difference purpose as mentioned above. Meanwhile, the aforementioned general-purpose contacts may be disposed instead of the ground contacts to be disposed in the short-circuit region.

Third Embodiment

An electronic apparatus according to a third embodiment will be described by focusing only on different features from those of the electronic apparatus of the first embodiment.

Figure 12:
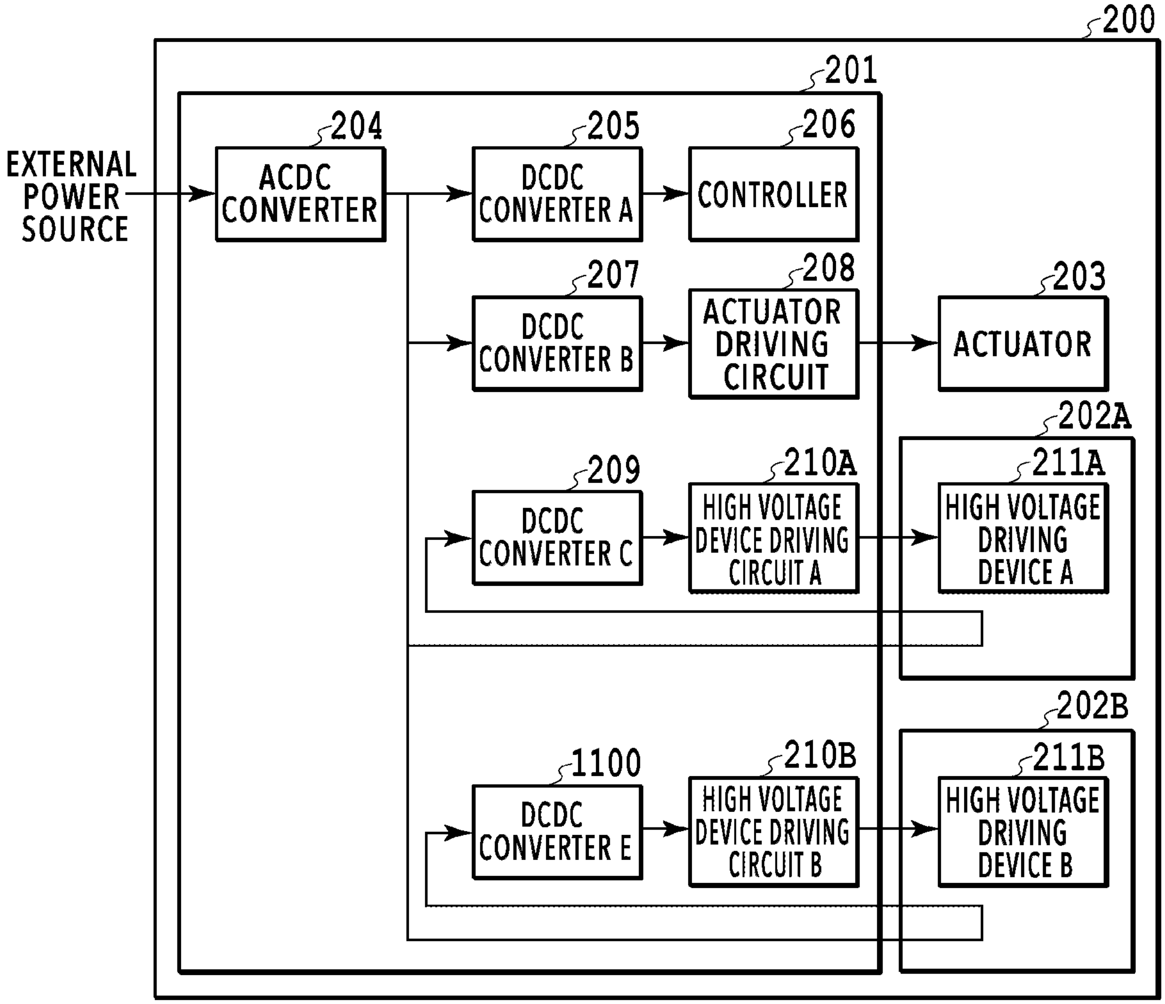
FIG. 12 is a block diagram showing a configuration of an electronic apparatus according to a first example of a third embodiment.

FIG. 12 shows a configuration of an electronic apparatus according to a first example of the third embodiment. In the first example of the third embodiment, the electronic apparatus 200 includes external units 202A and 202B, which are connected to the main body unit 201. The first example is premised on connection of the external units having the same configuration and the same functions. The main body unit 201 mounts a set of a high voltage device driving circuit and a DCDC converters for each of the external units. In other words, the main body unit 201 mounts the sets of the high voltage device driving circuits and the DCDC converters in accordance with the number of the external units to be connected thereto.

Figure 13:
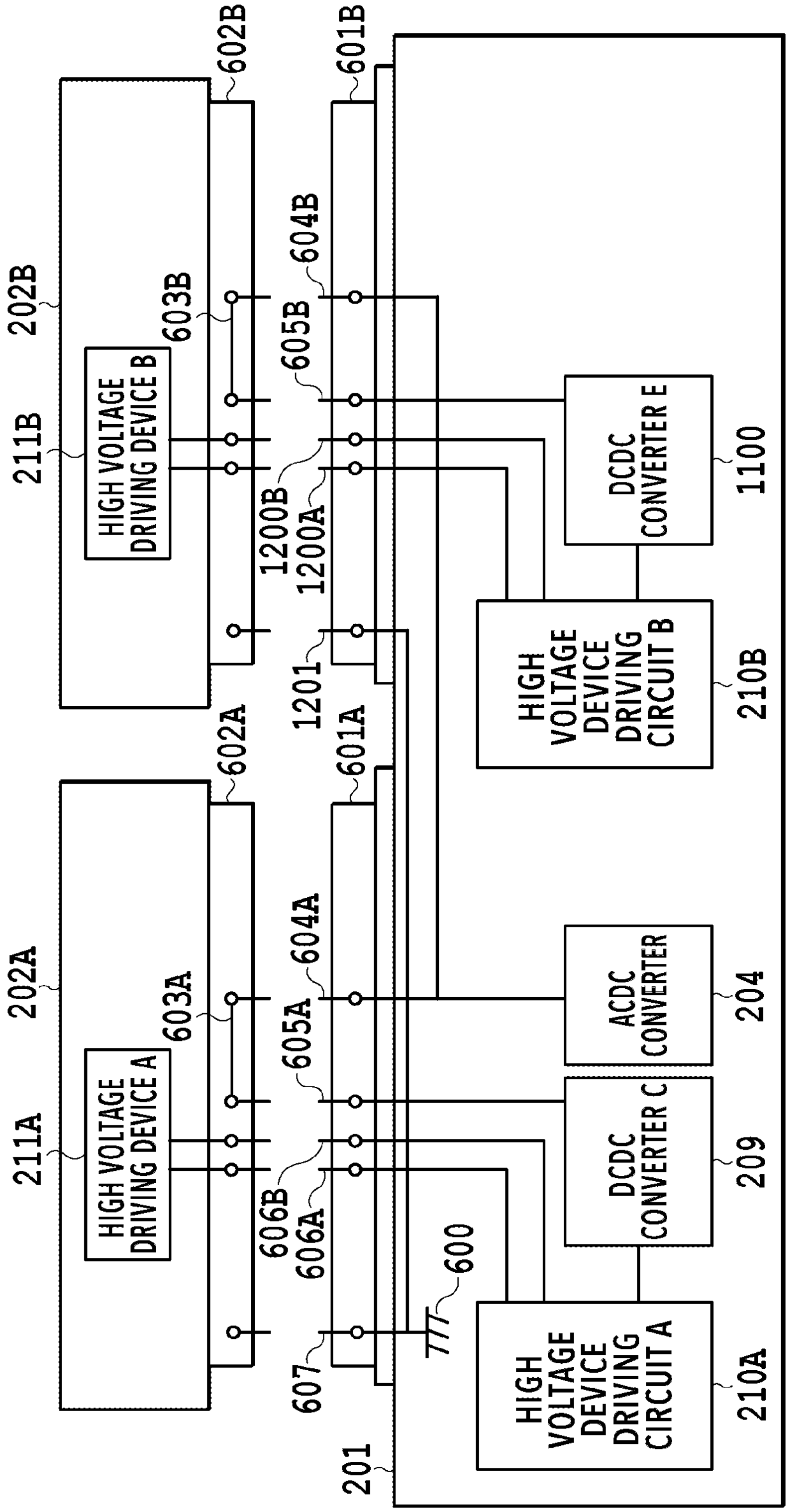
FIG. 13 is a diagram showing connection among units in the electronic apparatus of the first example of the third embodiment.

FIG. 13 shows connection among units in the electronic apparatus of the first example of the third embodiment. In the electronic apparatus, the external units 202A and 202B are connected to the common main body unit 201. Accordingly, the main body unit 201 is provided with main body connectors 601A and 601B in accordance with the number of the external units, which are fitted and connected to external connectors 602A and 602B of the external units 202A and 202B, respectively.

A high voltage device driving circuit A 210A is connected to a high voltage driving device A 211A through the main body connector 601A and the external connector 602A. Meanwhile, the ACDC converter 204 is connected to the DCDC converter C 209 through a loop-back 603A of the main body connector 601A and the external connector 602A. A high voltage device driving circuit B 210B is connected to a high voltage driving device B 211B through the main body connector 601B and the external connector 602B. Meanwhile, the ACDC converter 204 is connected to a DCDC converter E 1100 through a loop-back 603B of the main body connector 601B and the external connector 602B.

Meanwhile, since the main body unit 201 is provided with one ground 600, the ground contact 607 of the main body connector 601A and a ground contact 1201 of the main body connector 601B are connected to the common ground 600.

Figure 14:
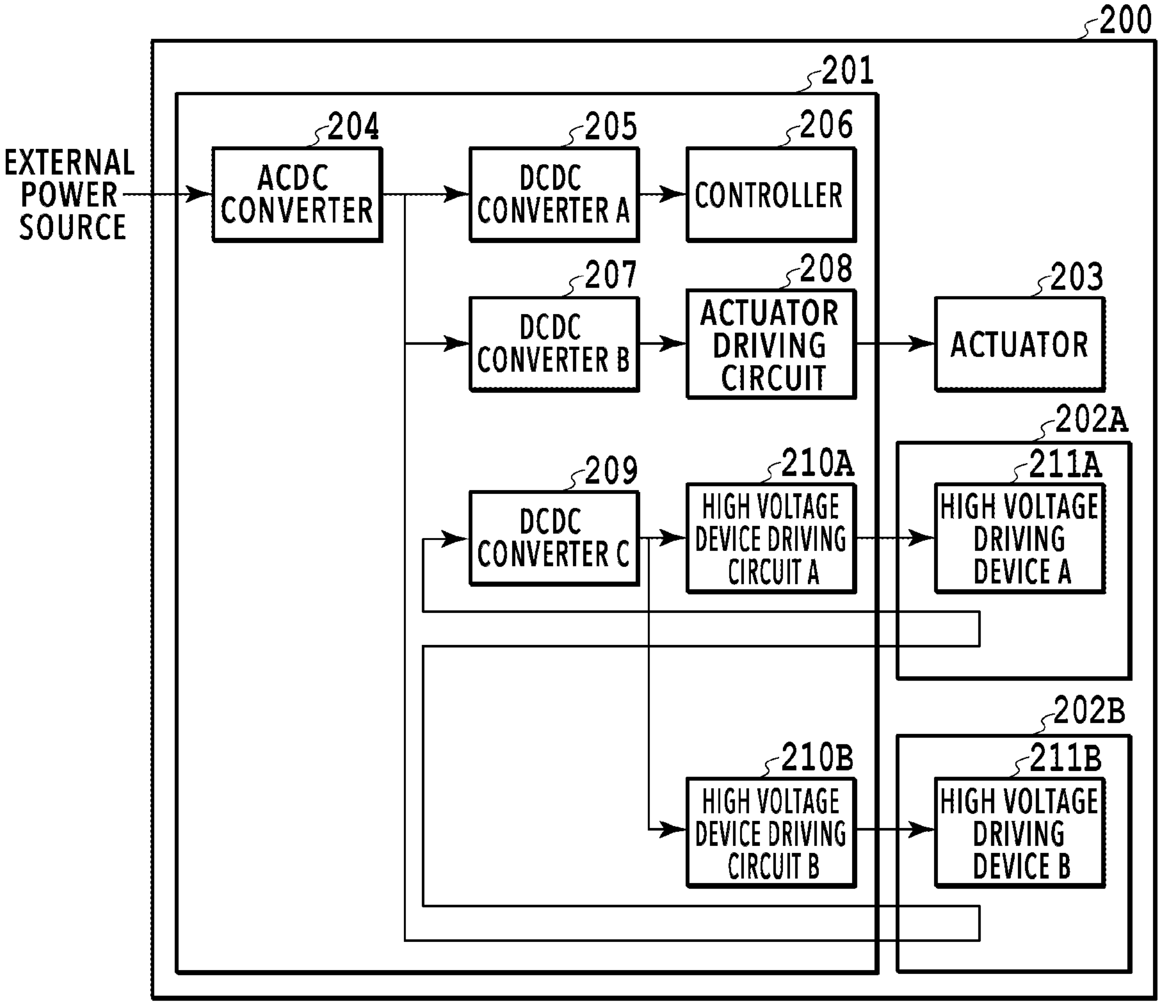
FIG. 14 is a block diagram showing a configuration of an electronic apparatus according to a second example of the third embodiment.

FIG. 14 shows a configuration of an electronic apparatus according to a second example of the third embodiment. The electronic apparatus 200 of the second example includes external units having the same configuration and the same functions in the second example as well. The second example is different from the first example in that a single DCDC converter is provided to supply the power source to the high voltage device driving circuits.

Figure 15:
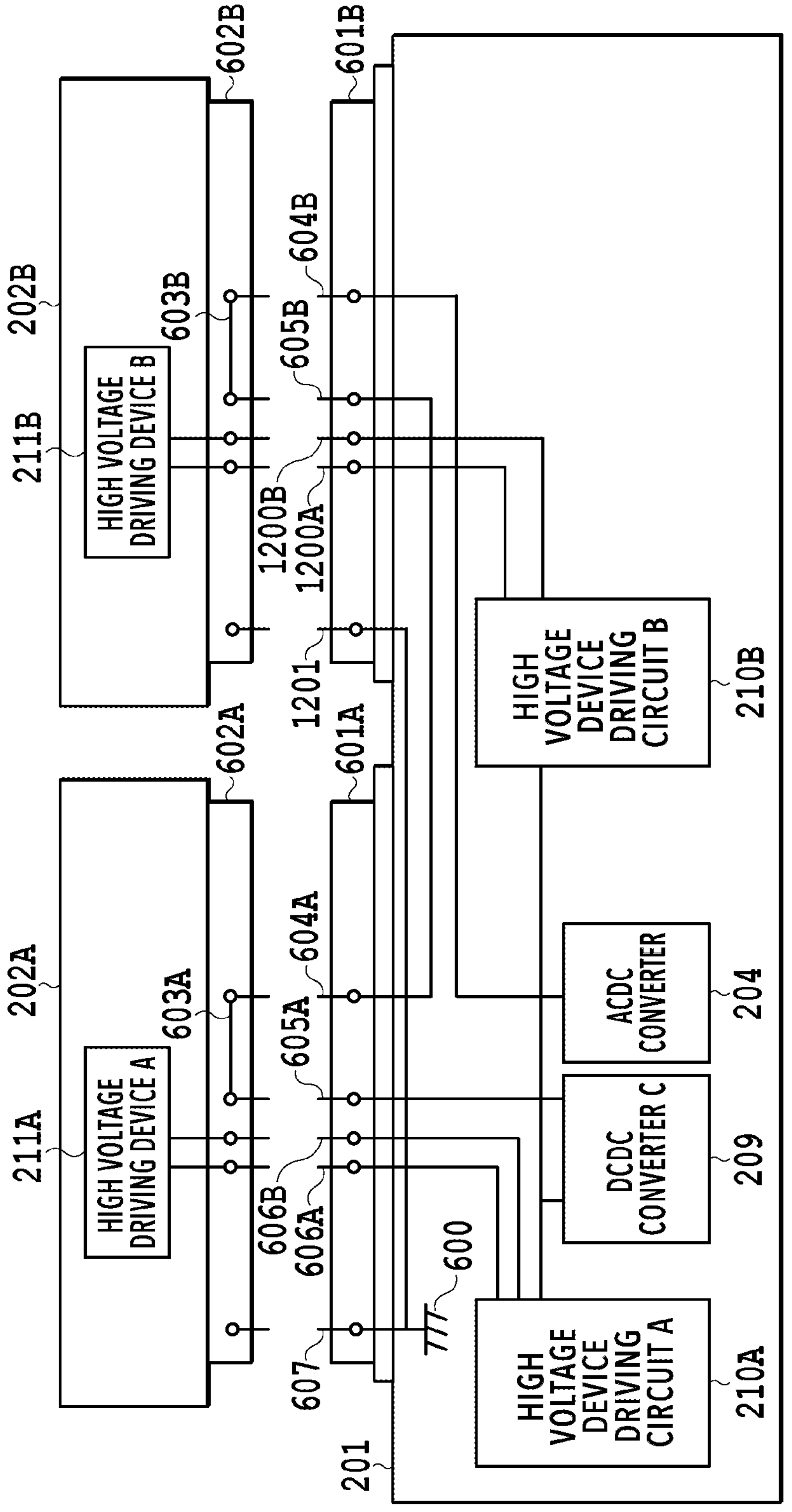
FIG. 15 is a diagram showing connection among units in the electronic apparatus of the second example of the third embodiment.

FIG. 15 shows connection among units in the electronic apparatus of the second example of the third embodiment. As with the first example, the main body unit 201 is provided with the main body connectors 601A and 601B in accordance with the number of the external units, which are fitted and connected to the external connectors 602A and 602B of the external units 202A and 202B, respectively. The high voltage device driving circuit A 210A is connected to the high voltage driving device A 211A through the main body connector 601A and the external connector 602A. The high voltage device driving circuit B 210B is connected to the high voltage driving device B 211B through the main body connector 601B and the external connector 602B.

The ACDC converter 204 is connected to the DCDC converter C 209 through the loop-back 603B of the main body connector 601B and the external connector 602B and further through the loop-back 603A of the main body connector 601A and the external connector 602A. In other words, the output terminal of the ACDC converter 204 is connected to the DCDC converter C 209 through both of the external unit 202B and the external unit 202A. In the second example, the output from the DCDC converter C 209 is discontinued in the case where one of the external units 202A and 202B is detached. As a consequence, the high voltage is not outputted from the two high voltage device driving circuits 210.

As with the first example, since the main body unit 201 is provided with one ground 600, the ground contact 607 of the main body connector 601A and the ground contact 1201 of the main body connector 601B are connected to the common ground 600.

In the third embodiment, in the case where the main body connector 601 is detached from the external connector 602, the ACDC converter 204, the DCDC converter C 209, and the DCDC converter E 1100 cannot maintain the physical connection through the loop-backs 603A and 603B. For this reason, the high voltage is not outputted from the DCDC converter C 209 or the DCDC converter E 1100. Accordingly, there is no output from the high voltage device driving circuit 210, either. As a consequence, the high voltage is not outputted to the contacts 606A and 606B for the high voltage driving device or to contacts 1200A and 1200B for the high voltage driving device.

Figure 16:
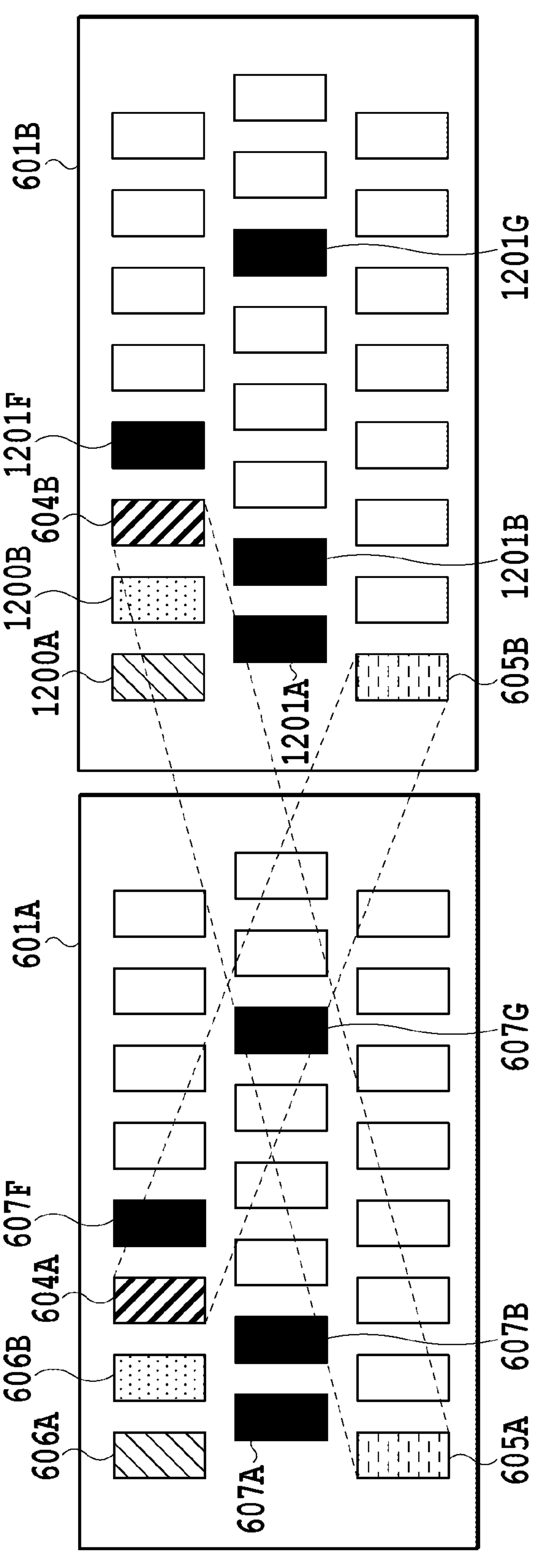
FIG. 16 is a diagram showing layouts of contacts of main body connectors.

FIG. 16 shows layouts of contacts of the main body connectors. The main body connector 601A includes the contacts 606A and 606B for the high voltage driving device A 211A, the ground contacts 607A and 607B, and an output contact 604A and an input contact 605A to be connected to the loop-back. The main body connector 601B includes the contacts 1200A and 1200B for the high voltage driving device B 211B, ground contacts 1201A and 1201B, and an output contact 604B and an input contact 605B to be connected to the loop-back. Layouts of the ground contacts 607A and 607B and the ground contacts 1201A and 1201B are the same as those of the first and second embodiments.

Moreover, ground contacts 607F and 607G are disposed between the output contact 604A of the main body connector 601A and the input contact 605B of the main body connector 601B in such a way as to overlap a short-circuit region between the two contacts. In the meantime, the ground contacts 607G and 1201A are disposed between the input contact 605A of the main body connector 601A and the output contact 604B of the main body connector 601B in such a way as to overlap a short-circuit region between the two contacts.

In the third embodiment, the main body connectors 601A and 601B are provided in order to connect the external units 202A and 202B to the main body unit 201. In the case where the external units are detached at a time, a conductive material may erroneously come into contact between the output contact disposed at one of the main body connectors and the input contact disposed at the other one of the main body connectors. In this case, the conductive material acts like the loop-back 603, and a high voltage is outputted from the DCDC converter C 209 or the DCDC converter E 1100 of the main body unit 201. According to the layout of the ground contacts 607F, 607G, and 1201A, the conductive material is highly likely to come into contact with the ground contacts 607F, 607G, and 1201A as well in the case where the connective material erroneously comes into contact between the two main body connectors 601A and 601B. In this instance, an electric current flows from the output contact 604 to the ground contacts 607F, 607G, and 1201A, and the power source is not supplied to the input contact 605. For this reason, the high voltage is not outputted from the DCDC converter C 209 or the DCDC converter E 1100 of the main body unit 201. Accordingly, the high voltage is not outputted from the contacts 606 and 1200 for the high voltage driving devices, either.

As a consequence, the high voltage is not outputted even if the user touches a terminal of any of the main body connectors 601A and 601B. Thus, it is possible to secure user safety.

In the third embodiment, the ground contact 607G is disposed between the two terminals of the output contact 604A and the input contact 605B as well as between the two terminals of the input contact 605A and the output contact 604B. Accordingly, the ground contact 607G can prevent the output of the high voltage even in a case of a short circuit between any of the pairs of the terminals. Meanwhile, the ground contact 1201A is disposed between the two terminals of the input contact 605A and the output contact 604B as well as between the two terminals of the output contact 604B and the input contact 605B. Accordingly, the ground contact 1201A can prevent the output of the high voltage even in the case of the short circuit between any of the pairs of the terminals.

As in the case of the ground contacts 607G and 1201A, the single ground contact can deal with short circuits among multiple contacts. Hence, it is possible to reduce the number of the ground contacts to be disposed in the short-circuit regions. Although the third embodiment has described the example of connecting the two external units, the number of the external units is not limited and the configuration discussed in the present embodiment is applicable to a configuration to connect more external units. In the meantime, the aforementioned general-purpose contacts may be disposed instead of the ground contacts to be disposed in the short-circuit regions.

Fourth Embodiment

An electronic apparatus according to a fourth embodiment will be described by focusing only on different features from those of the electronic apparatuses of the first to third embodiments.

Figure 17:
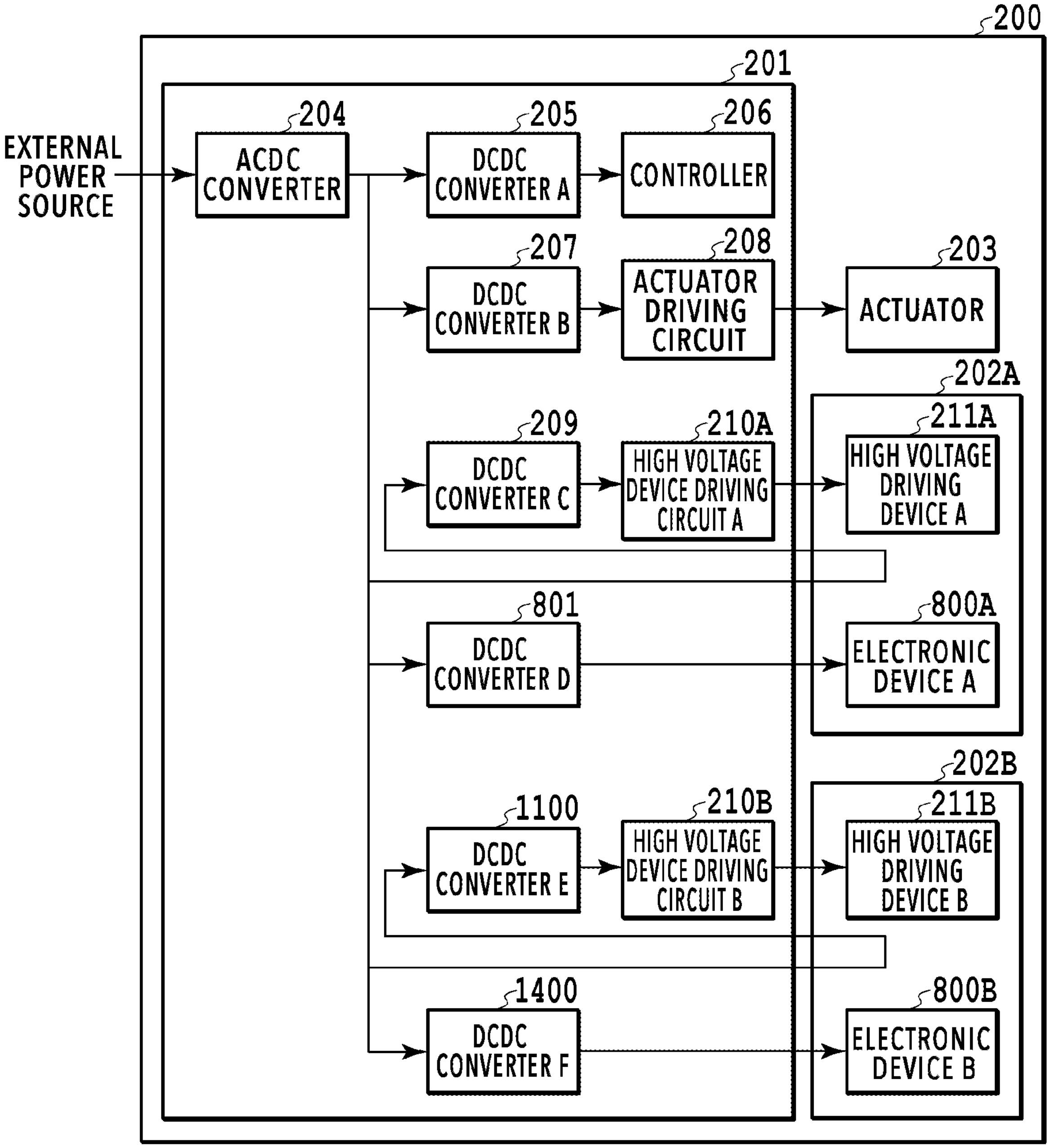
FIG. 17 is a block diagram showing a configuration of an electronic apparatus according to a fourth embodiment.

FIG. 17 shows a configuration of the electronic apparatus according to the fourth embodiment. In the fourth embodiment, the electronic apparatus 200 includes the external units 202 each mounting the electronic device 800 thereon, which are connected to the main body unit 201. The fourth embodiment is also premised on connection of the external units having the same configuration and the same functions. The main body unit 201 mounts a set of a high voltage device driving circuit and a DCDC converter for each of high voltage driving devices of the external units. Moreover, a DCDC converter is mounted for each of electronic devices of the external units. Each of electronic devices 800A and 800B may be a component of a control unit such as memory and a microcomputer, or may be an actuator.

Figure 18:
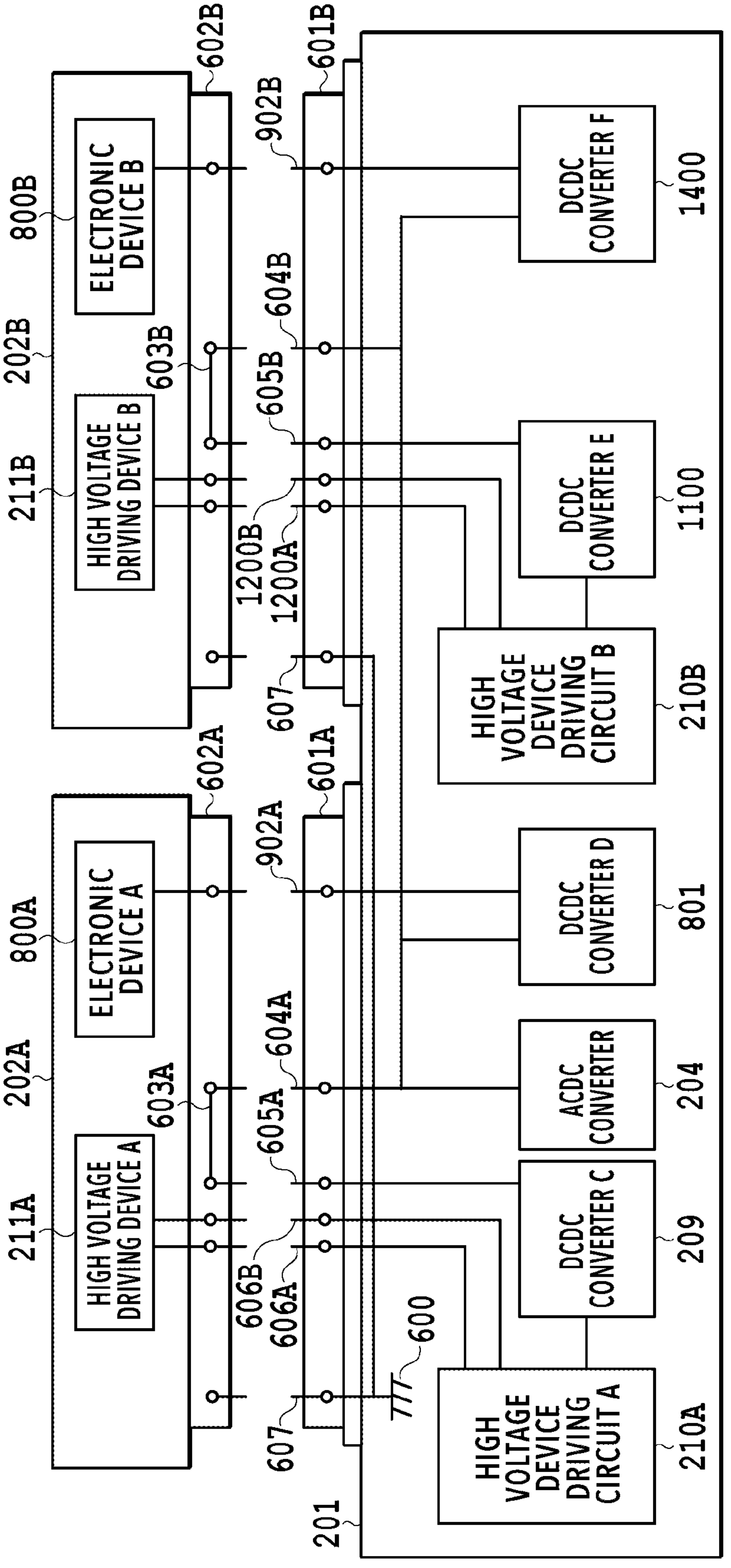
FIG. 18 is a diagram showing connection among units in the electronic apparatus of the fourth embodiment.

FIG. 18 shows connection among units in the electronic apparatus of the fourth embodiment. As with the third embodiment, the main body unit 201 is provided with the main body connectors 601A and 601B in accordance with the number of the external units, which are fitted and connected to the external connectors 602A and 602B of the external units 202A and 202B, respectively. Each of connection between the high voltage device driving circuit 210 and the high voltage driving device 211 and connection of the ACDC converter 204 to the DCDC converter C 209, the DCDC converter E 1100 is the same as the first example of the third embodiment.

Moreover, the output terminal of the DCDC converter D 801 is connected to the electronic device A 800A through a contact 902A for the electronic device A 800A provided to the main body connector 601A. An output terminal of a DCDC converter F 1400 is connected to the electronic device B 800B through the contact 902B for the electronic device B 800B provided to the main body connector 601B.

Figure 19:
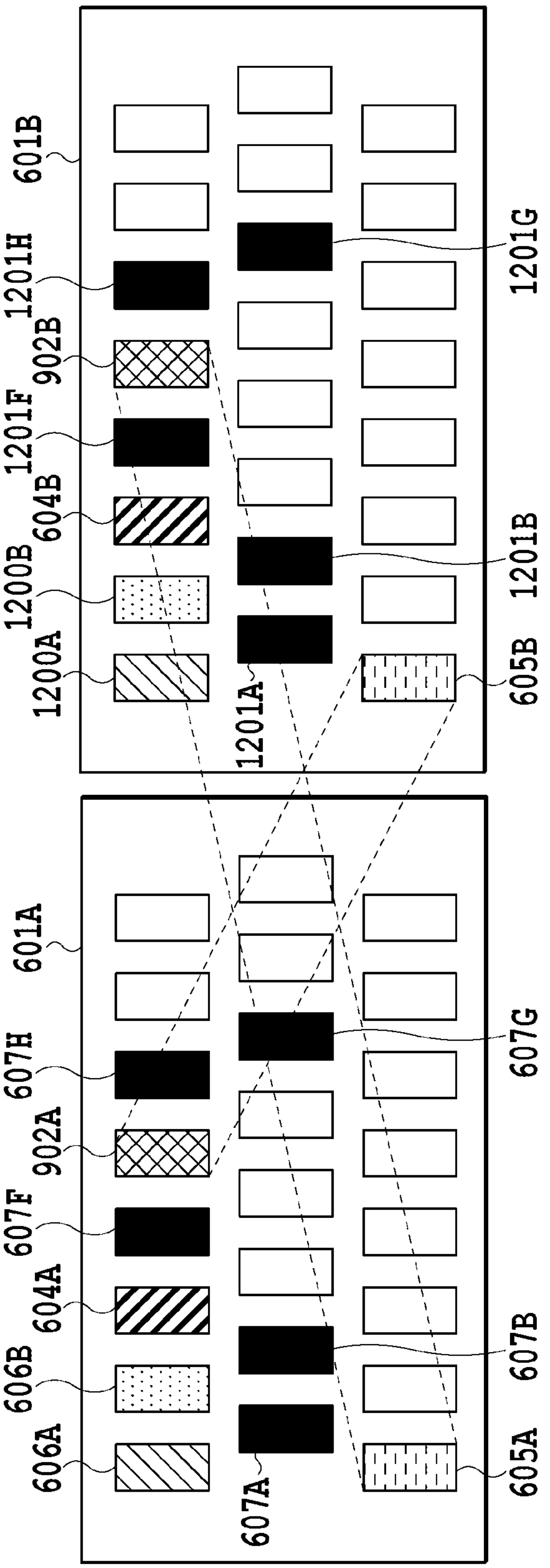
FIG. 19 is a diagram showing layouts of contacts of main body connectors.

FIG. 19 shows layouts of contacts of the main body connectors. The main body connector 601A includes the contacts 606A and 606B for the high voltage driving device A 211A, the ground contacts 607A and 607B, and the output contact 604A and the input contact 605A to be connected to the loop-back. The main body connector 601B includes the contacts 1200A and 1200B for the high voltage driving device B 211B, the ground contacts 1201A and 1201B, and the output contact 604B and the input contact 605B to be connected to the loop-back. The layouts of the ground contacts 607A and 607B and the ground contacts 1201A and 1201B are the same as the first and second embodiments. Meanwhile, the layout of the ground contacts 607F and 607G is the same as the third embodiment.

Moreover, ground contacts 607G and 607H are disposed between the contact 902A for the electronic device A 800A provided to the main body connector 601A and the input contact 605B of the main body connector 601B in such a way as to overlap a short-circuit region between the two contacts. In the meantime, the ground contacts 607G and 1201A are disposed between the input contact 605A of the main body connector 601A and the contact 902B for the electronic device B 800B provided to the main body connector 601B in such a way as to overlap a short-circuit region between the two contacts.

In the fourth embodiment, the main body connectors 601A and 601B are provided in order to connect the external units 202A and 202B to the main body unit 201. In the case where the external units are detached at a time, a conductive material may erroneously come into contact between the contact for the electronic device disposed at one of the main body connectors and the input contact disposed at the other one of the main body connectors. In this case, the conductive material acts like the loop-back 603, and a high voltage is outputted from the DCDC converter D 801 or the DCDC converter F 1400 of the main body unit 201. In this instance, the high voltage is outputted from the DCDC converter C 209 in the case where the output from the DCDC converter D 801 has a sufficient supply capacity for allowing the DCDC converter C 209 to output the high voltage, and there is a possibility of causing an unexpected malfunction. Meanwhile, the high voltage is outputted from the DCDC converter E 1100 in the case where the output from the DCDC converter F 1400 has a sufficient supply capacity for allowing the DCDC converter E 1100 to output the high voltage, and there is a possibility of causing an unexpected malfunction.

According to the layout of the ground contacts 607G, 607H, and 1201A, the conductive material is highly likely to come into contact with the ground contacts 607G, 607H, and 1201A as well in the case where the connective material erroneously comes into contact between the two main body connectors 601A and 601B. In this instance, an electric current flows from the output contact 604 to the ground contacts 607F, 607G, and 1201A, and the power source is not supplied to the input contact 605. For this reason, the high voltage is not outputted from the DCDC converter C 209 or the DCDC converter E 1100 of the main body unit 201. Accordingly, the high voltage is not outputted from the contacts 606 and 1200 for the high voltage driving devices, either.

As a consequence, the high voltage is not outputted even if the user touches a terminal of any of the main body connectors 601A and 601B. Thus, it is possible to secure user safety and to prevent a malfunction of the electronic apparatus.

The fourth embodiment has described the example in which the external unit 202A and the external unit 202B are the external units having the same configuration. However, the external unit 202A and the external unit 202B may be different external units. Even in a case where only the electronic device B 800B is mounted on the external unit 202B and the high voltage driving device B 211B is not mounted thereon, the same operation and effects can be obtained from a configuration similar to the configuration of the present embodiment.

The ground contact 607G is disposed between the output contact 604A and the input contact 605B, between the input contact 605A and the output contact 604B, and between the contact 902A for the electronic device 800A and input contact 605B. Since the single ground contact can deal with short circuits among the multiple contacts, it is possible to reduce the number of the ground contacts to be disposed in the short-circuit regions. Meanwhile, as with ground contact 607G, the ground contact 1201A can also deal with short-circuits among the multiple contacts. Note that the aforementioned general-purpose contacts may be disposed instead of the ground contacts to be disposed in the short-circuit regions.

Fifth Embodiment

An electronic apparatus according to a fifth embodiment will be described by focusing only on different features from those of the electronic apparatus of the first embodiment.

Figure 20:
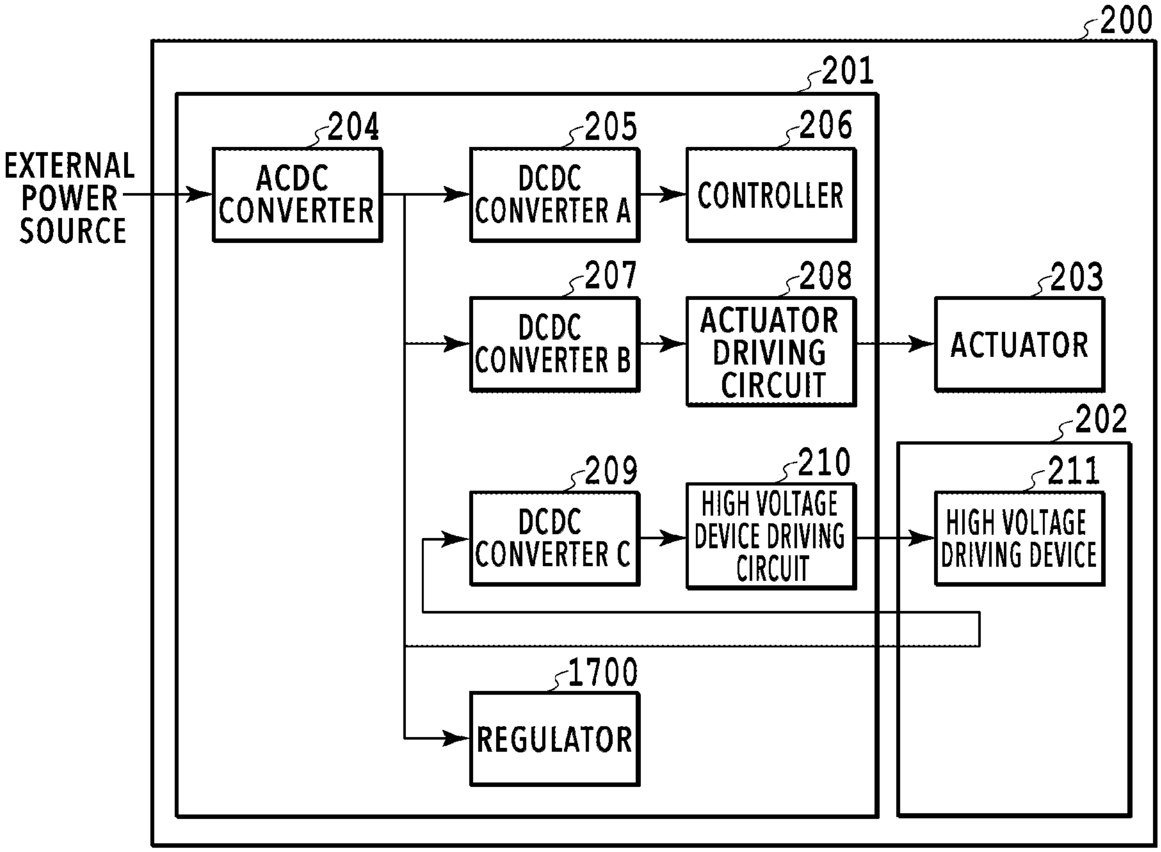
FIG. 20 is a block diagram showing a configuration of an electronic apparatus according to a fifth embodiment.

FIG. 20 shows a configuration of the electronic apparatus according to the fifth embodiment. In the electronic apparatus 200 of the fifth embodiment, a regulator 1700 is mounted on the main body unit 201. The regulator 1700 receives power supply from the ACDC converter 204. However, the regulator 1700 may be configured to receive power supply from one of the DCDC converters instead. The regulator 1700 is a power source that is required by a different block in the main body unit 201 or in the external unit 202, which is not shown in FIG. 20.

The regulator 1700 may be either a transistor circuit or a circuit controlled at a constant voltage with a Zener diode. Output from the regulator 1700 only needs to lack a sufficient supply capability for allowing the high voltage device driving circuit 210 to output a high voltage through the DCDC converter C 209 even in a case where the output from the regulator 1700 is inputted to an input terminal of the DCDC converter C 209 or of the high voltage device driving circuit 210.

Figure 21:
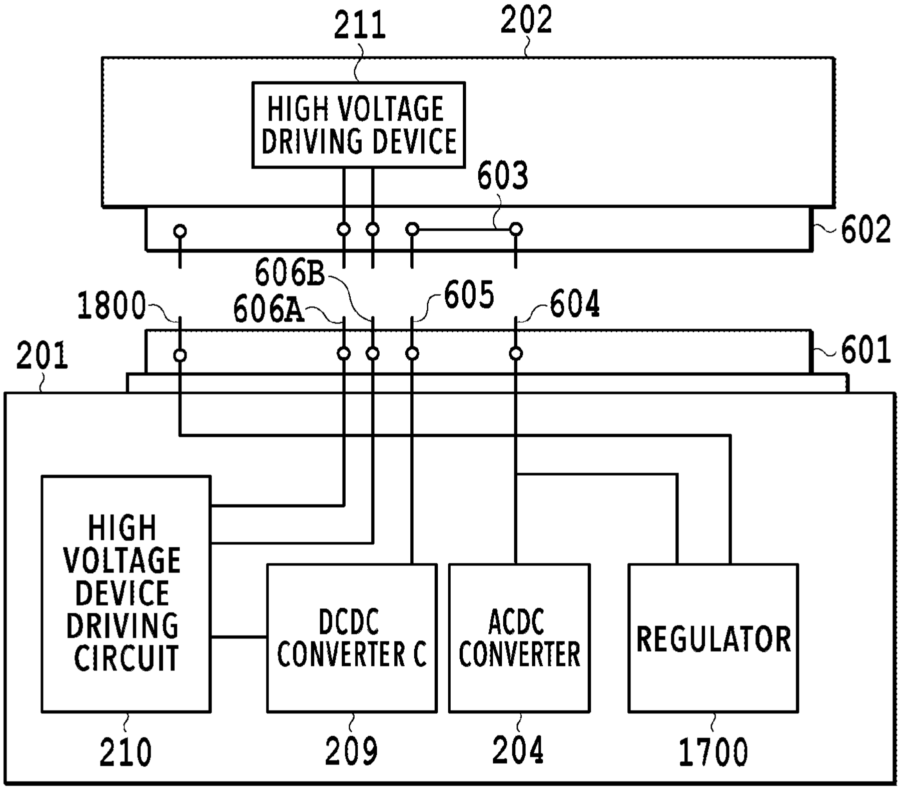
FIG. 21 is a diagram showing connection among units in the electronic apparatus of the fifth embodiment.

FIG. 21 shows connection among units in the electronic apparatus of the fifth embodiment. The main body unit 201 is connected to the external unit 202 by fitting the main body connector 601 to the external connector 602. A regulator contact 1800 to be connected to an output terminal of the regulator 1700 is disposed at the main body connector 601. In other words, the regulator contact 1800 corresponds to the above-mentioned general-purpose contact.

Figure 22:
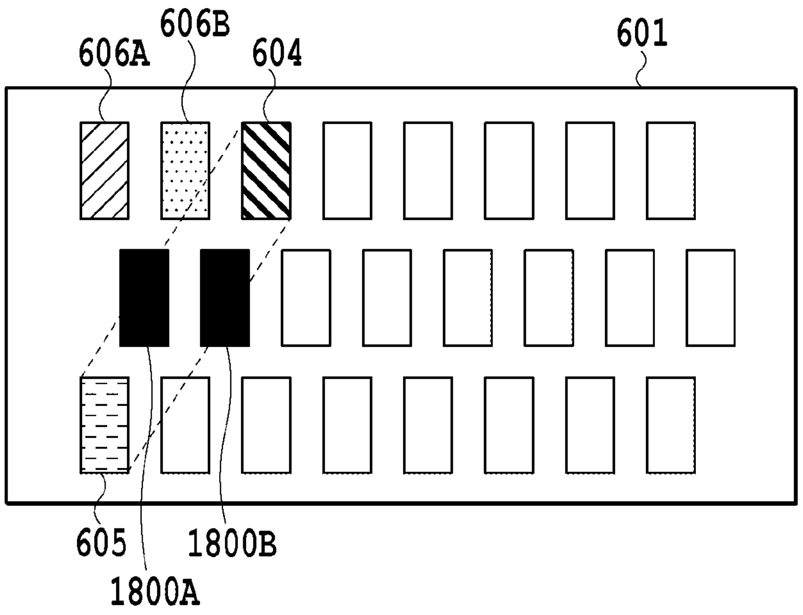
FIG. 22 is a diagram showing a layout of contacts of a main body connector.

FIG. 22 shows a layout of contacts of the main body connector. The main body connector 601 includes the contacts 606A and 606B for the high voltage driving device 211, and the output contact 604 and the input contact 605 to be connected to the loop-back, which are shown in FIG. 6. The main body connector 601 includes other contacts for supplying signals and a power source necessary for other devices mounted on the external unit 202. These other contacts are fitted and connected to the external connector 602, thus enabling functional connection between the main body unit 201 and the external unit 202.

Unlike the first embodiment, regulator contacts 1800A and 1800B are disposed between the output contact 604 and the input contact 605. The regulator contacts 1800 are preferably disposed in such a way as to overlap a short-circuit region surrounded by two straight lines each connecting between the outer edge of the output contact 604 and the outer edge of the input contact 605.

In the case where the main body connector 601 is detached from the external connector 602 and a short circuit is caused by erroneous contact of a conductive material between the output contact 604 and the input contact 605, the conductive material acts like the loop-back 603. As a consequence, a high voltage is outputted from the DCDC converter C 209 of the main body unit 201. Accordingly, the regulator contacts 1800 are disposed in such a way as to overlap the short-circuit region surrounded by the two straight lines each connecting between the outer edge of the output contact 604 and the outer edge of the input contact 605. In the case of the erroneous contact of the conductive material between the output contact 604 and the input contact 605, the conductive material is highly likely to come into contact with any of the regulator contacts 1800 as well. In this instance, an electric current flows from the output contact 604 to the regulator contacts 1800. Since the regulator 1700 has a low power supply capacity, the regulator 1700 cannot drive the DCDC converter C 209 or the high voltage device driving circuit 210 and the high voltage is not outputted from the contacts 606A and 606B for the high voltage driving device 211, either.

As a consequence, in the case where the conductive material erroneously comes into contact between the output contact 604 and the input contact 605, the high voltage is not outputted even if the user touches a terminal of the main body connector 601. Thus, it is possible to secure user safety.

Here, the two regulator contacts 1800 are provided between the output contact 604 and the input contact 605. However, a single regulator contact 1800 or multiple regulator contacts 1800 may be provided and the number of the regulator contacts 1800 is not limited. The regulator contacts 1800 are preferably disposed in the vicinity of two contacts in order to avoid a malfunction due to the erroneous connection between these two contacts. It is more preferable to dispose the regulator contacts 1800 at contacts that are adjacent to these two contacts. Most of the contacts disposed in the vicinity of these two contacts overlap the short-circuit region. Accordingly, it is possible to reduce the number of the regulator contacts 1800 to be disposed in the short-circuit region by defining only the contacts disposed in the vicinity of the two contacts as the regulator contacts 1800.

Sixth Embodiment

The first to fifth embodiments have described the configuration in which the external unit 202 mounts the high voltage driving device 211 and the main body connector 601 includes the contacts to output the high voltage. On the other hand, the present disclosure is applicable to a configuration in which the high voltage is not outputted to the external unit 202. In a case where the external unit 202 is detached from the main body unit 201, the power supply to the external unit 202 is shut down so that a malfunction of the electronic apparatus can be prevented even if a user touches a terminal of the main body connector 601.

Figure 23:
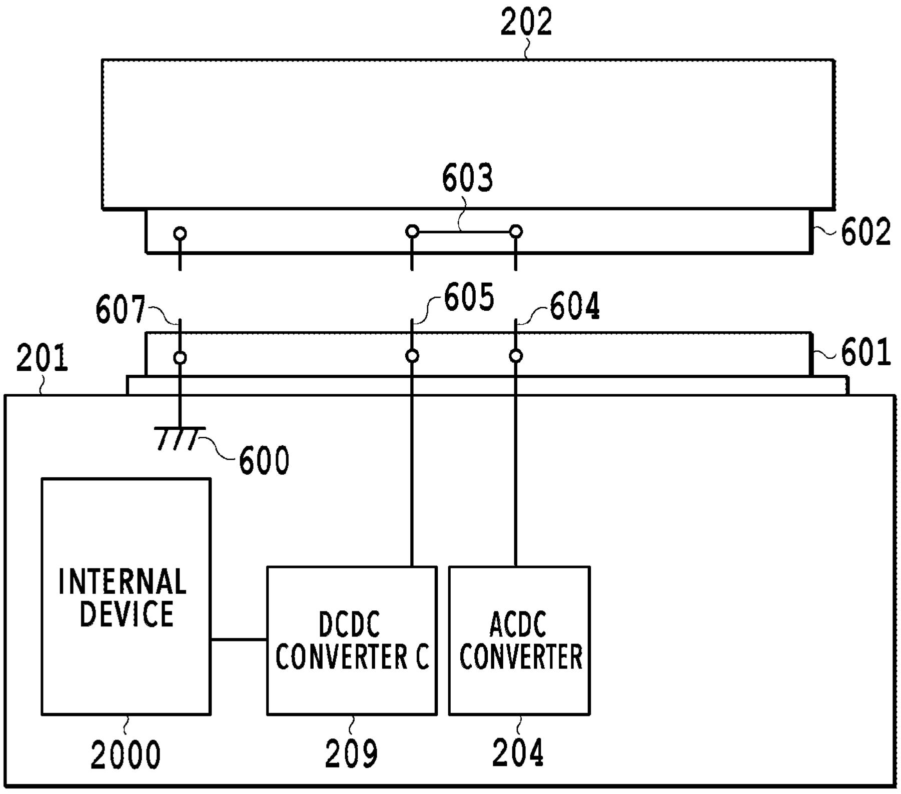
FIG. 23 is a diagram showing connection among units in an electronic apparatus of a sixth embodiment.

FIG. 23 shows connection among units in an electronic apparatus of the sixth embodiment. An internal device 2000 is mounted on the main body unit 201. The output from the ACDC converter 204 is outputted from the output contact 604, and is inputted from the input contact 605 to the DCDC converter C 209 through the loop-back 603. The main body connector 601 includes other multiple contacts for supplying signals and a power source necessary for other devices mounted on the external unit 202. These other contacts are fitted and connected to the external connector 602, thus enabling functional connection between the main body unit 201 and the external unit 202.

As with the first to fifth embodiments, the ground contact or the general-purpose contact is disposed in such a way as to overlap a short-circuit region surrounded by two straight lines each connecting between the outer edge of the output contact 604 and the outer edge of the input contact 605. In the case where the main body connector 601 is detached from the external connector 602 and a short circuit is caused by erroneous contact of a conductive material between the output contact 604 and the input contact 605, the power source is not supplied to the input contact 605. Accordingly, it is possible to stop the power supply to the internal device 2000 and to prevent a malfunction of the electronic apparatus even if the user touches a terminal of the main body connector 601.

Other Embodiments

The above-described embodiments are widely adaptable to electronic apparatuses in general. The embodiments are adaptable not only to the printing apparatus described as the example in the first embodiment but also to a broad range of electronic apparatuses including industrial apparatuses, consumer apparatuses, and the like. It is to be noted that the above-described embodiments are not intended to restrict the contents of the present disclosure, and that the entire combination of the features described in each of the embodiments is not always essential for a solution of the present disclosure. Moreover, relative layouts, shapes and other features of the constituents described in each of the embodiments are merely exemplary and are not intended to limit the contents of the present disclosure thereto.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-202148, filed Dec. 19, 2022, which is hereby incorporated by reference wherein in its entirety.

What is claimed is:

1. An electronic apparatus provided with an external unit being attachable to and detachable from a main body unit, comprising:

a main body connector attached to the main body unit and including an input contact of a driving circuit to drive a driving device for the external unit, and an output contact from a first power source; and a loop-back unit including a path to connect the output contact and the input contact to the external unit, wherein the main body connector includes a ground contact between the output contact and the input contact.

2. The electronic apparatus according to claim 1, wherein the ground contact is disposed in such a way as to overlap a region surrounded by two straight lines each connecting between an outer edge of the output contact and an outer edge of the input contact.

3. The electronic apparatus according to claim 1, wherein the ground contact is allocated to a contact being adjacent to at least one of the output contact and the input contact.

4. The electronic apparatus according to claim 1, further comprising:

a second power source provided to the main body unit and configured to receive power supply from the first power source and to drive an electronic device of the external unit, wherein the main body connector includes the ground contact between a contact connected to an output terminal of the second power source and the input contact.

5. The electronic apparatus according to claim 4, wherein the first power source outputs a voltage higher than a voltage outputted from the second power source.

6. The electronic apparatus according to claim 5, wherein the first power source outputs the high voltage of any of a direct-current voltage equal to or above 60 V and an alternating-current voltage having a peak value equal to or above 42.4 V.

7. The electronic apparatus according to claim 1, comprising:

a plurality of the external units; and a plurality of the main body connectors provided to the plurality of the external units, respectively, wherein the ground contact is provided between the output contact of one main body connector out of the plurality of the main body connectors and the input contact of another main body connector out of the plurality of main body connectors.

8. The electronic apparatus according to claim 7, further comprising:

a plurality of second power sources provided to the main body unit and configured to drive respective electronic devices of the plurality of the external units, wherein the ground contact is provided between a contact connected to an output terminal of one second power source out of the plurality of the second power sources in one main body connector out of the plurality of the main body connectors and the input contact of another main body connector out of the plurality of the main body connectors.

9. The electronic apparatus according to claim 1, wherein the external unit is a print head which ejects the ink.

10. An electronic apparatus provided with an external unit being attachable to and detachable from a main body unit, comprising:

a main body connector attached to the main body unit and including an input contact of a driving circuit to drive a driving device for the external unit, and an output contact from a first power source; and a loop-back unit including a path to connect the output contact and the input contact to the external unit, wherein the main body connector includes a general-purpose contact between the output contact and the input contact, the general-purpose contact being incapable of supplying necessary electric power to the driving circuit.

11. The electronic apparatus according to claim 10, wherein the general-purpose contact is disposed in such a way as to overlap a region surrounded by two straight lines each connecting between an outer edge of the output contact and an outer edge of the input contact.

12. The electronic apparatus according to claim 10, wherein the general-purpose contact is allocated to a contact being adjacent to at least one of the output contact and the input contact.

* * * * *